US012195848B2

(12) United States Patent
Harada et al.

(10) Patent No.: US 12,195,848 B2
(45) Date of Patent: Jan. 14, 2025

(54) METHOD OF CLEANING, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Kazuhiro Harada, Toyama (JP); Shingo Nohara, Toyama (JP); Yuji Urano, Toyama (JP); Yasunobu Koshi, Toyama (JP); Masayoshi Minami, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 18/174,248

(22) Filed: Feb. 24, 2023

(65) Prior Publication Data

US 2023/0220546 A1    Jul. 13, 2023

Related U.S. Application Data

(63) Continuation of application No. 16/573,554, filed on Sep. 17, 2019, now Pat. No. 11,618,947.

(30) Foreign Application Priority Data

Sep. 25, 2018  (JP) .................................. 2018-178942

(51) Int. Cl.
 *C23C 16/44*     (2006.01)
 *C23C 16/52*     (2006.01)
 *H01L 21/67*     (2006.01)

(52) U.S. Cl.
 CPC ...... *C23C 16/4405* (2013.01); *C23C 16/4412* (2013.01); *C23C 16/52* (2013.01); *H01L 21/67248* (2013.01); *H01L 21/67253* (2013.01)

(58) Field of Classification Search
 CPC . C23C 16/4405; C23C 16/4412; C23C 16/52; C23C 16/4409; C23C 16/4584;
 (Continued)

(56) References Cited

U.S. PATENT DOCUMENTS 9,540,727 B2   1/2017   Kameda et al.
9,587,308 B2   3/2017   Kameda et al.
(Continued)

FOREIGN PATENT DOCUMENTS

JP   09-186149 A     7/1997
JP   2004-311929 A   11/2004
(Continued)

OTHER PUBLICATIONS

Japanese Office Action issued on Feb. 22, 2022 for Japanese Patent Application No. 2021-053056.
(Continued)

*Primary Examiner* — Duy N Deo
*Assistant Examiner* — Christopher Remavege
(74) *Attorney, Agent, or Firm* — Volpe Koenig

(57) ABSTRACT

There is provided a technique of cleaning an inside of a process container, including: (a) removing substances adhered in a process container set at a first temperature by supplying a first gas at a first flow rate into the process container and exhausting the inside of the process container; (b) physically desorbing and removing residual fluorine in the process container set at a second temperature by supplying a second gas at a second flow rate into the process container and exhausting the inside of the process container; and (c) chemically desorbing and removing residual fluorine in the process container set at a third temperature by supplying a third gas at a third flow rate into the process container and exhausting the inside of the process container.

22 Claims, 6 Drawing Sheets

(58) Field of Classification Search
CPC ......... H01L 21/67248; H01L 21/67253; H01L 21/67028; H01L 21/02046; H01L 21/67017; H01L 21/02337; H01L 21/67098

See application file for complete search history.

(56) References Cited

U.S. PATENT DOCUMENTS

| | | | |
|---|---|---|---|
| 11,786,946 B2* | 10/2023 | Son | C23C 16/45561 134/21 |
| 2005/0082002 A1* | 4/2005 | Sato | B08B 7/00 156/345.29 |
| 2006/0027249 A1* | 2/2006 | Johnson | C23C 16/4405 134/1.1 |
| 2006/0213539 A1* | 9/2006 | Hasebe | C23C 16/4404 427/535 |
| 2008/0132079 A1 | 6/2008 | Okada et al. | |
| 2008/0282976 A1* | 11/2008 | Okada | C23C 16/345 438/778 |
| 2011/0000508 A1* | 1/2011 | Sonobe | B08B 7/00 134/22.1 |
| 2011/0318937 A1 | 12/2011 | Akae et al. | |
| 2013/0017685 A1 | 1/2013 | Akae et al. | |
| 2013/0065402 A1 | 3/2013 | Kameda et al. | |
| 2013/0220377 A1 | 8/2013 | Sato et al. | |
| 2015/0232986 A1 | 8/2015 | Kameda et al. | |
| 2015/0376781 A1 | 12/2015 | Kogura et al. | |
| 2016/0020071 A1* | 1/2016 | Khaja | H01J 37/32357 427/569 |
| 2016/0181116 A1 | 6/2016 | Berry | |
| 2016/0293398 A1 | 10/2016 | Danek | |
| 2016/0303620 A1* | 10/2016 | Kim | C11D 7/02 |
| 2017/0087606 A1* | 3/2017 | Nakamura | C23C 16/52 |

FOREIGN PATENT DOCUMENTS

| | | |
|---|---|---|
| JP | 2012-019194 A | 1/2012 |
| JP | 2012-532440 A | 12/2012 |
| JP | 2015-153956 A | 8/2015 |
| JP | 2017-069230 A | 4/2017 |
| WO | 2011/111498 A1 | 9/2011 |
| WO | 2011/013810 A1 | 1/2013 |

OTHER PUBLICATIONS

Chinese Office Action issued on Mar. 8, 2023 for Chinese Patent Application No. 201910860140.9.

* cited by examiner

METHOD OF CLEANING, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a continuation application based upon U.S. patent application Ser. No. 16/573,554 filed on Sep. 17, 2019, which is based upon and claims the benefit of priority from Japanese Patent Application No. 2018-178942, filed on Sep. 25, 2018, the entire contents of which are incorporated herein by reference.

TECHNICAL FIELD

The present disclosure relates to a method of cleaning, a method of manufacturing a semiconductor device, a substrate processing apparatus, and a recording medium.

BACKGROUND

As a process of manufacturing a semiconductor device, a process of cleaning the inside of a process container by supplying a gas including a fluorine-based gas into the process container after performing substrate processing for forming a film over a substrate is often carried out. In this case, when the next substrate processing is performed in the cleaned process container, the productivity may be deteriorated.

SUMMARY

Some embodiments of the present disclosure provide a technique capable of performing the next substrate processing without deteriorating the productivity after cleaning the inside of a process container.

According to one or more embodiments of the present disclosure, there is provided a technique of cleaning an inside of a process container, including: (a) removing substances adhered in a process container set at a first temperature after performing a process on a substrate by supplying a first gas including a fluorine-based gas at a first flow rate into the process container and exhausting the inside of the process container; (b) physically desorbing and removing residual fluorine in the process container set at a second temperature higher than the first temperature after performing (a) by supplying a second gas, which does not react chemically with fluorine under the second temperature, at a second flow rate higher than the first flow rate and a third flow rate into the process container and exhausting the inside of the process container; and (c) chemically desorbing and removing residual fluorine in the process container set at a third temperature higher than the first temperature after performing (a) by supplying a third gas, which reacts chemically with fluorine under the third temperature, at the third flow rate into the process container and exhausting the inside of the process container.

DETAILED DESCRIPTION

One or More Embodiments of the Present Disclosure

One or more embodiments of the present disclosure will be now described with reference to FIGS. 1 to 4.

(1) Configuration of Substrate Processing Apparatus

Figure 1:
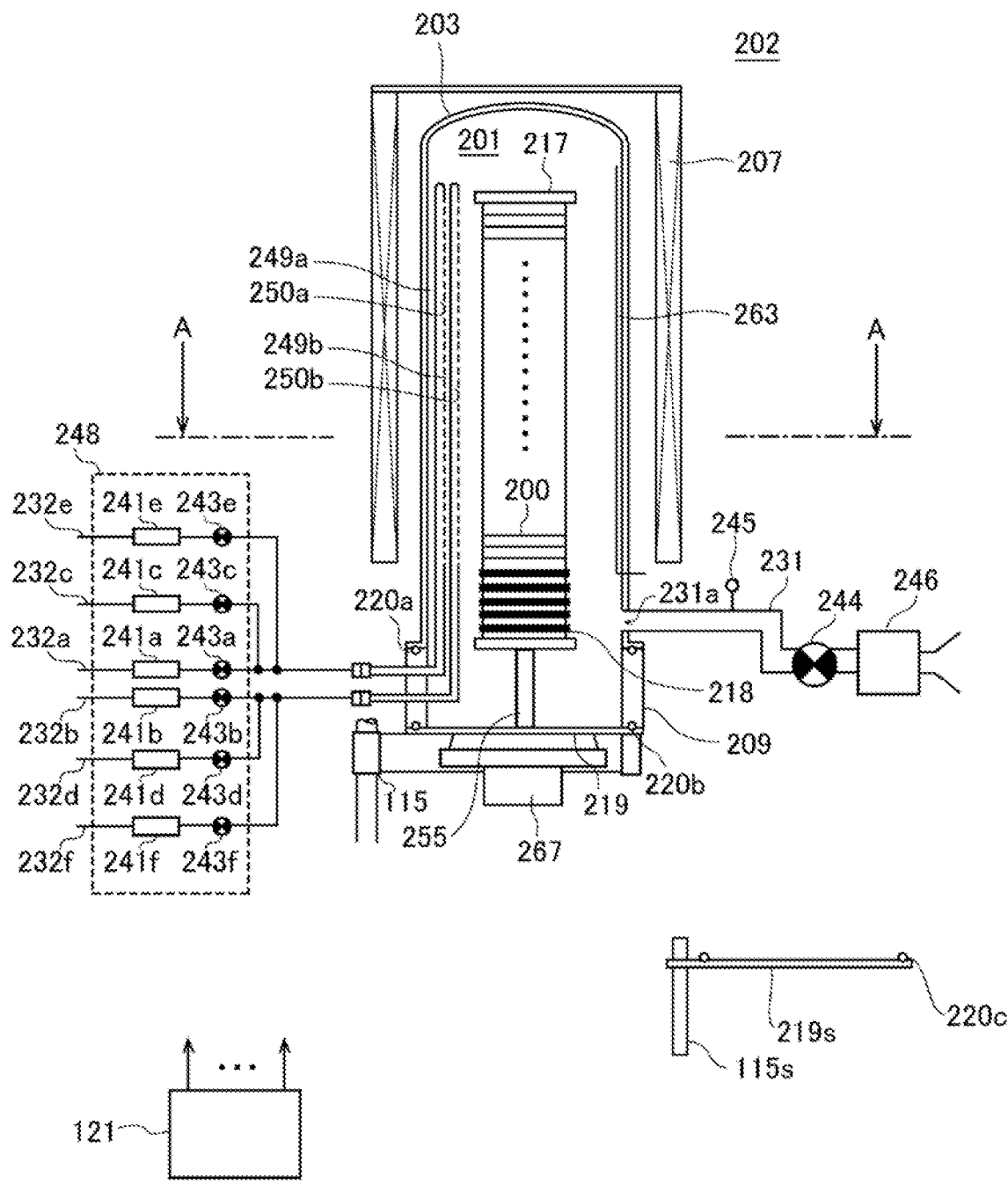
FIG. 1 is a schematic configuration view of a vertical process furnace of a substrate processing apparatus suitably used in embodiments of the present disclosure, in which a portion of the process furnace is shown in a vertical cross section.

As illustrated in FIG. 1, a process furnace 202 includes a heater 207 as a heating mechanism (a temperature adjustment part). The heater 207 has a cylindrical shape and is supported by a support plate so as to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz ($SiO_2$), silicon carbide (SiC) or the like, and has a cylindrical shape with its upper end closed and its lower end opened. A manifold 209 is disposed to be concentric with the reaction tube 203 under the reaction tube 203. The manifold 209 is made of, for example, a metal material such as stainless steel (SUS: Steel Use Stainless) or the like, and has a cylindrical shape with both of its upper and lower ends opened. The upper end portion of the manifold 209 engages with the lower end portion of the reaction tube 203 so as to support the reaction tube 203. An O-ring 220a serving as a seal member is installed between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to accommodate a plurality of wafers 200 as substrates. Processing on the wafers 200 is performed in the process chamber 201.

Nozzles 249a and 249b as first and second supply parts are installed in the process chamber 201 so as to penetrate through a sidewall of the manifold 209. The nozzles 249a and 249b are also called first and second nozzles. The nozzles 249a and 249b are made of, for example, a heat resistant material such as quartz, SiC or the like. Gas supply pipes 232a and 232b are connected to the nozzles 249a and 249b, respectively. The nozzles 249a and 249b are different from each other.

Mass flow controllers (MFCs) 241a and 241b, which are flow rate controllers (flow rate control parts), and valves 243a and 243b, which are opening/closing valves, are installed in the gas supply pipes 232a and 232b, respectively, sequentially from the upstream side of gas flow. Gas supply pipes 232c and 232e are connected to the gas supply pipe 232a at the downstream side of the valve 243a. Gas supply pipes 232d and 232f are connected to the gas supply pipe 232b at the downstream side of the valve 243b. MFCs 241c to 241f and valves 243c to 243f are installed in the gas supply pipes 232c to 232f, respectively, sequentially from the upstream side of gas flow. The gas supply pipes 232c to 232f are made of, for example, a metal material such as stainless steel (SUS) or the like.

Figure 2:
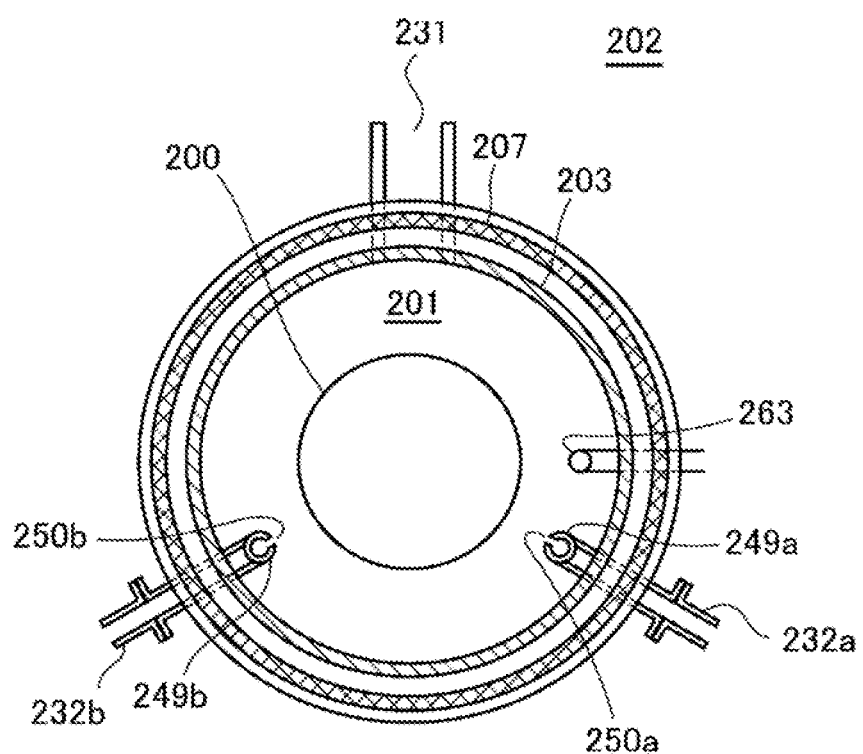
FIG. 2 is a schematic configuration view of the vertical process furnace of the substrate processing apparatus suitably used in the embodiments of the present disclosure, in which a portion of the process furnace is shown in a cross section taken along line A-A in FIG. 1.

As illustrated in FIG. 2, each of the nozzles 249a and 249b is disposed in an annular space (in a plane view) between an inner wall of the reaction tube 203 and the wafers 200 so as to extend upward along an arrangement direction of the wafers 200 from a lower portion of the inner wall of the reaction tube 203 to an upper portion thereof. Specifically, each of the nozzles 249a and 249b is installed in a region horizontally surrounding a wafer arrangement region in which the wafers 200 are arranged at a lateral side of the wafer arrangement region, along the wafer arrangement region. Gas supply holes 250a and 250b for supplying a gas are formed on side surfaces of the nozzles 249a and 249b, respectively. The gas supply holes 250a and 250b allow the gas to be supplied toward the wafers 200. A plurality of gas supply holes 250a and 250b may be formed from a lower portion of the reaction tube 203 to an upper portion thereof.

A precursor (precursor gas), for example, a halosilane-based gas containing Si, which is a predetermined element (main element) constituting a film, and a halogen element, is supplied from the gas supply pipe 232a into the process chamber 201 via the MFC 241a, the valve 243a, and the nozzle 249a. The precursor gas refers to a gaseous precursor, for example, a precursor which remains in a gas state at room temperature and atmospheric pressure, or gas obtained by vaporizing a precursor which remains in a liquid state at room temperature and atmospheric pressure. The halosilane refers to silane including a halogen group. The halogen group includes a chloro group, a fluoro group, a bromo group, an iodo group, and the like. That is, the halogen group includes halogen elements such as chlorine (Cl), fluorine (F), bromine (Br), iodine (I), and the like. An example of the halosilane-based gas may include a precursor gas containing Si and Cl, that is, a chlorosilane-based gas. The chlorosilane-based gas acts as a Si source. An example of the chlorosilane-based gas may include a hexachlorodisilane ($Si_2Cl_6$, abbreviation: HCDS) gas. The HCDS gas is a gas containing an element (Si) which becomes solid alone under a process condition to be described below, that is, a gas capable of depositing a film alone under the process condition to be described below.

A reactant (reaction gas), for example, a hydrogen nitride-based gas, which is a nitrogen (N)-containing gas, is supplied from the gas supply pipe 232b into the process chamber 201 via the MFC 241b, the valve 243b, and the nozzle 249b. The hydrogen nitride-based gas acts as a nitriding gas, that is, an N source. An example of the hydrogen nitride-based gas may include an ammonia ($NH_3$) gas. The $NH_3$ gas is a gas containing an element (N) which does not become solid alone under the process condition to be described below, that is, a gas incapable of depositing a film alone under the process condition to be described below.

A fluorine-based gas is supplied from the gas supply pipe 232c into the process chamber 201 via the MFC 241c, the valve 243c, the gas supply pipe 232a, and the nozzle 249a. An example of the fluorine-based gas may include a fluorine ($F_2$) gas.

A nitrogen oxide-based gas is supplied from the gas supply pipe 232d into the process chamber 201 via the MFC 241d, the valve 243d, the gas supply pipe 232b, and the nozzle 249b. The nitrogen oxide-based gas alone does not show a cleaning effect, but reacts with the fluorine-based gas to generate active species such as fluorine radicals, a nitrosyl fluoride compound and the like and thus act to improve the cleaning effect of the fluorine-based gas. An example of the nitrogen oxide-based gas may include a nitrogen monoxide (NO) gas.

An inert gas, for example, a nitrogen ($N_2$) gas, is supplied from the gas supply pipes 232e and 232f into the process chamber 201 via the MFCs 241e and 241f, the valves 243e and 243f, the gas supply pipes 232a and 232b, and the nozzles 249a and 249b, respectively. The $N_2$ gas acts as a purge gas, a carrier gas, a dilution gas, or the like.

A precursor supply system mainly includes the gas supply pipe 232a, the MFC 241a, and the valve 243a. A reactant supply system mainly includes the gas supply pipe 232b, the MFC 241b, and the valve 243b. A fluorine-based gas supply system mainly includes the gas supply pipe 232c, the MFC 241c, and the valve 243c. A nitrogen oxide-based gas supply system mainly includes the gas supply pipe 232d, the MFC 241d, and the valve 243d. An inert gas supply system mainly includes the gas supply pipes 232e and 232f, the MFCs 241e and 241f, and the valves 243e and 243f.

In Step A to be described below, the fluorine-based gas supply system functions as a first gas supply system that supplies a first gas including a fluorine-based gas into the process container. In Step A, as the first gas, a fluorine-based gas and a nitrogen oxide-based gas can be mixed and used in the process container. Therefore, the nitrogen oxide gas supply system may be included in the first gas supply system. Further, in step B to be described below, the inert gas supply system functions as a second gas supply system that supplies a second gas that does not make chemical reaction with fluorine under a second temperature to be described below. In addition, in step C to be described below, the nitrogen oxide gas supply system functions as a third gas supply system that supplies a third gas that makes chemical reaction with fluorine under a third temperature to be described below.

One or all of the above-described various supply systems may be configured as an integrated-type supply system 248 in which the valves 243a to 243f, the MFCs 241a to 241f, and so on are integrated. The integrated-type supply system 248 is connected to each of the gas supply pipes 232a to 232f. In addition, the integrated-type supply system 248 may be configured such that operations of supplying various gases into the gas supply pipes 232a to 232f (that is, opening/closing operation of the valves 243a to 243f, flow rate adjustment operation by the MFCs 241a to 241f, and the like) are controlled by a controller 121 which will be described below. The integrated-type supply system 248 is configured as an integral type or detachable-type integrated unit, and may be attached to and detached from the gas supply pipes 232a to 232f and the like on an integrated unit basis, so that the maintenance, replacement, extension, etc. of the integrated-type supply system 248 can be performed on an integrated unit basis.

An exhaust port 231a for exhausting the internal atmosphere of the process chamber 201 is installed below the sidewall of the reaction tube 203. The exhaust port 231a may be installed from a lower portion of the sidewall of the reaction tube 203 to an upper portion thereof, that is, along the wafer arrangement region. An exhaust pipe 231 is connected to the exhaust port 231a. The exhaust pipe 231 is made of, for example, a metal material such as SUS. A vacuum exhaust device, e.g., a vacuum pump 246, is connected to the exhaust pipe 231 via a pressure sensor 245, which is a pressure detector (pressure-detecting part) for detecting the internal pressure of the process chamber 201, and an APC (auto pressure controller) valve 244, which is a pressure regulator (pressure adjustment part). The APC valve 244 is configured to perform or stop a vacuum-exhausting operation in the process chamber 201 by opening/closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening cover configured to hermetically seal a lower end opening of the manifold 209, is installed under the manifold 209. The seal cap 219 is made of, for example, a metal material such as stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described below, is installed under the seal cap 219. A rotary shaft 255 of the rotation mechanism 267, which is made of a metal material such as SUS or the like, is connected to the boat 217 through the seal cap 219. The rotation mechanism 267 is configured to rotate the wafers 200 by rotating the boat 217. The seal cap 219 is configured to be vertically moved up and down by a boat elevator 115 which is an elevating mechanism installed outside the reaction tube 203. The boat elevator 115 is configured as a transfer device (transfer mechanism) which loads/unloads (transfers) the wafers 200 into/out of the process chamber 201 by moving the seal cap 219 up and down. A shutter 219s, which serves as a furnace opening cover configured to hermetically seal a lower end opening of the manifold 209 in a state where the seal cap 219 is lowered and the boat 217 is unloaded from the process chamber 201, is installed under the manifold 209. The shutter 219s is made of, for example, a metal material such as stainless steel (SUS) or the like, and is formed in a disc shape. An O-ring 220c, which is a seal member making contact with the lower end portion of the manifold 209, is installed on an upper surface of the shutter 219s. The opening/closing operation (such as elevation operation, rotation operation, or the like) of the shutter 219s is controlled by a shutter-opening/closing mechanism 115s.

The exhaust pipe 231, the manifold 209, the seal cap 219, the rotary shaft 255, the shutter 219s, and so on may be made of an alloy having excellent heat resistance and corrosion resistance. An example of the alloy used may include Hastelloy® whose heat resistance and corrosion resistance are enhanced by adding iron (Fe), molybdenum (Mo), chromium (Cr), etc. to nickel (Ni), Inconel® whose heat resistance and corrosion resistance are enhanced by adding Fe, Cr, niobium (Nb), Mo, etc. to Ni, or the like, in addition to SUS.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that an inside of the process chamber 201 has a desired temperature distribution. The temperature sensor 263 is installed along the inner wall of the reaction tube 203.

Figure 3:
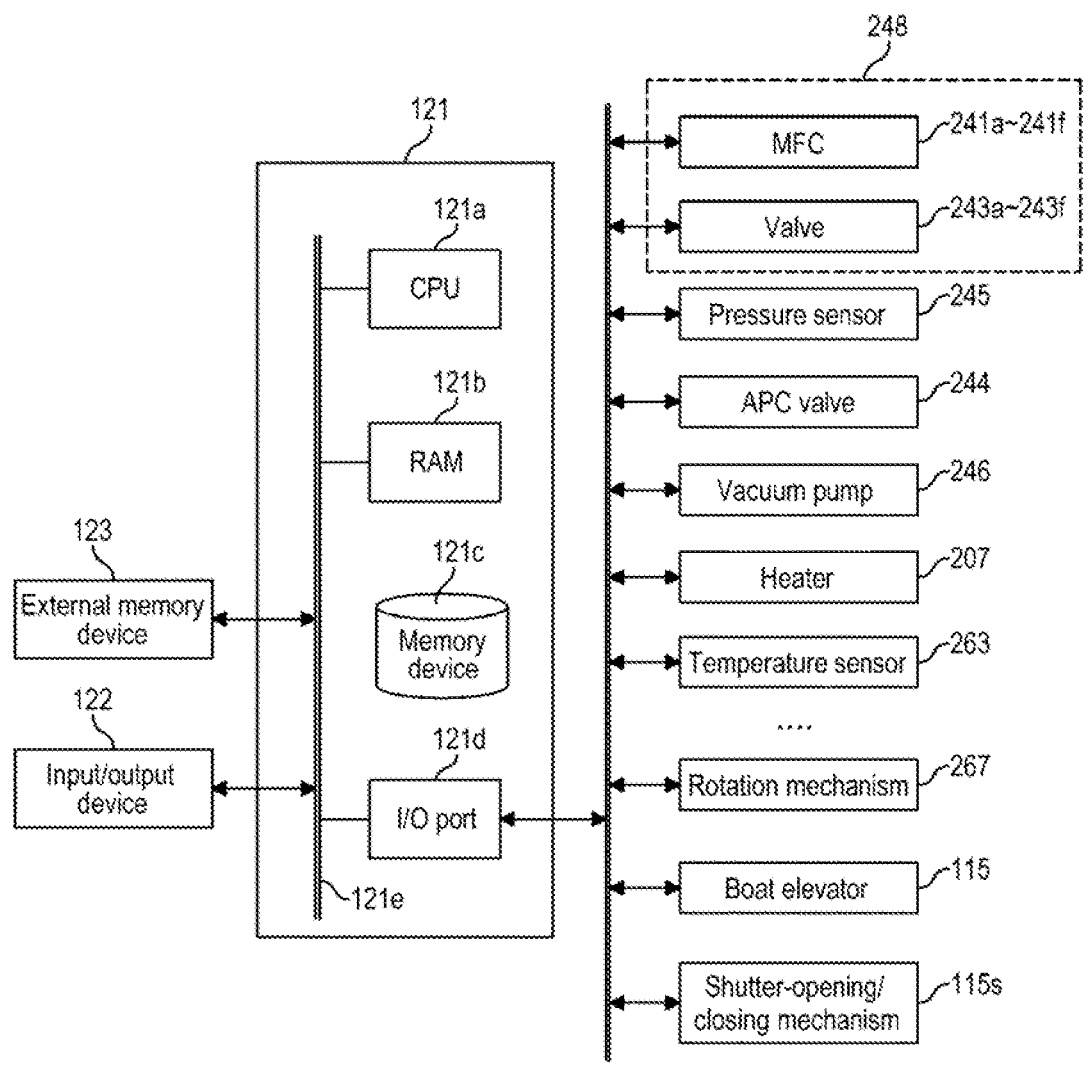
FIG. 3 is a schematic configuration diagram of a controller of the substrate processing apparatus suitably used in the embodiments of the present disclosure, in which a control system of the controller is shown in a block diagram.

As illustrated in FIG. 3, a controller 121, which is a control part (control means), may be configured as a computer including a CPU (central processing unit) 121a, a RAM (random access memory) 121b, a memory device 121c, and an I/O port 121d. The RAM 121b, the memory device 121c, and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a HDD (hard disk drive), or the like. A control program for controlling operations of a substrate processing apparatus, a process recipe in which sequences and conditions of substrate processing to be described below are written, and a cleaning recipe in which sequences and conditions of a cleaning process to be described below are written, are readably stored in the memory device 121c. The process recipe functions as a program for causing the controller 121 to execute each sequence in the substrate processing, which will be described below, to obtain an expected result. The cleaning recipe functions as a program for causing the controller 121 to execute each sequence in the cleaning process, which will be described below, to obtain an expected result. Hereinafter, the process recipe, the cleaning recipe and the control program may be generally and simply referred to as a "program." Furthermore, the process recipe and the cleaning recipe may be simply referred to as a "recipe." When the term "program" is used herein, it may indicate a case of including the recipe, a case of including the control program, or a case of including both the recipe and the control program. The RAM 121b is configured as a memory area (work area) in which a program, data, or so on read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter-opening/closing mechanism 115s, and so on.

The CPU 121a is configured to read and execute the control program from the memory device 121c. The CPU 121a is also configured to read the recipe from the memory device 121c according to an input and so on of an operation command from the input/output device 122. In addition, the CPU 121a is configured to control the flow-rate-adjusting operation of various kinds of gases by the MFCs 241a to 241f, the opening/closing operation of the valves 243a to 243f, the opening/closing operation of the APC valve 244, the pressure-adjusting operation performed by the APC valve 244 based on the pressure sensor 245, the actuating and stopping of the vacuum pump 246, the temperature-adjusting operation performed by the heater 207 based on the temperature sensor 263, the operation of rotating the boat 217 with the rotation mechanism 267 and adjusting the rotation speed of the boat 217, the operation of moving the boat 217 up and down by the boat elevator 115, the opening/closing operation of the shutter 219s by the shutter-opening/closing mechanism 115s, and so on, according to contents of the read recipe.

The controller 121 may be configured by installing, on the computer, the aforementioned program stored in an external memory device 123 (for example, a magnetic disk such as an HDD, an optical disc such as a CD, a magneto-optical disc such as an MO, or a semiconductor memory such as a USB memory). The memory device 121c or the external memory device 123 is configured as a non-transitory computer-readable recording medium. Hereinafter, the memory device 121c and/or the external memory device 123 may be generally and simply referred to as a "recording medium." When the term "recording medium" is used herein, it may indicate a case of including the memory device 121c, a case of including the external memory device 123, or a case of including both the memory device 121c and the external memory device 123. Furthermore, the program may be provided to the computer using communication means such as the Internet or a dedicated line, instead of using the external memory device 123.

(2) Substrate-Processing Process

A substrate-processing sequence example of forming a film over a wafer 200 as a substrate using the aforementioned substrate processing apparatus, that is, a film-forming sequence example, which is one of the processes for manufacturing a semiconductor device, will be described. In the following descriptions, the operations of the respective parts constituting the substrate processing apparatus are controlled by the controller 121.

In the film-forming sequence according to the present embodiments, a silicon nitride film (SiN film), which is a film containing Si and N, is formed as a film over the wafer 200 by performing a cycle a predetermined number of times, the cycle including non-simultaneously performing: step 1 of supplying an HCDS gas as a precursor to the wafer 200 in the process container, and step 2 of supplying an NH$_3$ gas as a reactant to the wafer 200 in the process container.

In the present disclosure, for the sake of convenience, the film-forming sequence may be denoted as follows. The same denotation may be used in modification examples to be described below.

(HCDS→NH$_3$)×n⇒SiN

When the term "wafer" is used in the present disclosure, it may refer to "a wafer itself" or "a wafer and a laminated body of certain layers or films formed over a surface of the wafer." When the phrase "a surface of a wafer" is used in the present disclosure, it may refer to "a surface of a wafer itself" or "a surface of a certain layer formed over a wafer". When the expression "a certain layer is formed over a wafer" is used in the present disclosure, it may mean that "a certain layer is formed directly on a surface of a wafer itself" or that "a certain layer is formed on a layer formed over a wafer." When the term "substrate" is used in the present disclosure, it may be synonymous with the term "wafer."

(Wafer Charging and Boat Loading)

When a plurality of wafers 200 are charged on the boat 217 (wafer charging), the shutter 219s is moved by the shutter-opening/closing mechanism 115s, and the lower end opening of the manifold 209 is opened (shutter open). Then, as illustrated in FIG. 1, the boat 217 supporting the plurality of wafers 200 is lifted up by the boat elevator 115 to be loaded into the process chamber 201 (boat loading). In this state, the seal cap 219 seals the lower end of the manifold 209 via the O-ring 220b.

(Pressure Adjustment and Temperature Adjustment)

The inside of the process chamber 201, that is, a space in which the wafers 200 are placed, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information. The wafers 200 in the process chamber 201 are heated by the heater 207 to a desired temperature. In this operation, the state of supplying electric power to the heater 207 is feedback-controlled based on the temperature information detected by the temperature sensor 263 such that the inside of the process chamber 201 has a desired temperature distribution. The rotation of the wafers 200 by the rotation mechanism 267 is then started. Exhausting the inside of the process chamber 201 and heating and rotating the wafers 200 may be continuously performed at least until processing of the wafers 200 is completed.

(Film Forming Step)

The following steps 1 and 2 are then performed in a sequential manner.

[Step 1]

In this step, an HCDS gas is supplied to the wafer 200 in the process chamber 201 (HCDS gas supplying step). Specifically, the valve 243a is opened to allow the HCDS gas to flow through the gas supply pipe 232a. The flow rate of the HCDS gas is adjusted by the MFC 241a, and then the HCDS gas is supplied into the process chamber 201 via the nozzle 249a and is exhausted through the exhaust port 231a. In this operation, the HCDS gas is supplied to the wafer 200. At this time, the valves 243e and 243f may be opened to supply a N$_2$ gas into the process chamber 201 via the nozzles 249a and 249b.

The example of the process condition in this step is described as follows.

Supply flow rate of HCDS gas: 0.01 to 2 slm, specifically 0.1 to 1 slm

Supply flow rate of N$_2$ gas (for each gas supply pipe): 0 to 10 slm

Gas supply time of each gas: 1 to 120 seconds, specifically 1 to 60 seconds

Processing temperature: 250 to 800 degrees C., specifically 400 to 700 degrees C.

Processing pressure: 1 to 2,666 Pa, specifically 67 to 1,333 Pa.

In the present disclosure, the notation of a numerical range such as "250 to 400 degrees C." means that the lower limit value and the upper limit value are included in the range. For example, "250 to 800 degrees C." means "equal to or higher than 250 degrees C. and equal to or lower than 800 degrees C." The same applies to other numerical ranges.

By supplying the HCDS gas to the wafer 200 under the aforementioned condition, a Si-containing layer containing Cl is formed as a first layer over the outermost surface of the wafer 200. The Si-containing layer containing Cl is formed when HCDS is physically adsorbed on the outermost surface of the wafer 200, when a substance (hereinafter, $Si_xCl_y$) into which HCDS is partially decomposed is chemically adsorbed thereon, or when Si is deposited thereon by thermal decomposition of HCDS. The Si-containing layer containing Cl may be an adsorption layer (physical adsorption layer or chemical adsorption layer) of HCDS or $Si_xCl_y$, or may be a Si layer (Si deposition layer) containing Cl. In the present disclosure, a Si-containing layer containing Cl is simply referred to as a Si-containing layer.

After the first layer is formed, the valve 243a is closed to stop the supply of the HCDS gas into the process chamber 201. Then, the inside of the process chamber 201 is vacuum-exhausted, and a gas and the like remaining in the process chamber 201 are excluded from the inside of the process chamber 201 (purge step). At this time, the valves 243e and 243f are opened to supply a $N_2$ gas into the process chamber 201. The $N_2$ gas acts as a purge gas.

As the precursor, in addition to the HCDS gas, it may be possible to use, e.g., chlorosilane-based gases such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, an octachlorotrisilane ($Si_3Cl_8$, abbreviation: OCTS) gas, and the like. Like the HCDS gas, these gases are gases that can deposit a film alone under the aforementioned process condition.

Example of the inert gas may include a rare gas such as Ar gas, He gas, Ne gas, Xe gas, or the like, in addition to the $N_2$ gas. The same applies to step 2 and a cleaning process, which will be described below.

[Step 2]

After Step 1 is ended, an $NH_3$ gas is supplied to the wafer 200 in the process chamber 201, specifically, the first layer formed over the wafer 200 ($NH_3$ gas supplying step). Specifically, the valve 243b is opened to allow the $NH_3$ gas to flow through the gas supply pipe 232b. The flow rate of the $NH_3$ gas is adjusted by the MFC 241b, and then the $NH_3$ gas is supplied into the process chamber 201 via the nozzle 249b and is exhausted through the exhaust port 231a. At this operation, the $NH_3$ gas is supplied to the wafer 200. At this time, the valves 243e and 243f may be opened to supply a $N_2$ gas into the process chamber 201 via the nozzles 249a and 249b.

The example of the process condition in this step is described as follows.

Supply flow rate of $NH_3$ gas: 0.1 to 10 slm
Supply flow rate of $N_2$ gas (for each gas supply pipe): 0 to 2 slm
Supply time of $NH_3$ gas: 1 to 120 seconds, specifically 1 to 60 seconds
Processing pressure: 1 to 4,000 Pa, specifically 1 to 3,000 Pa
The other process condition is the same as the process condition in Step 1.

By supplying the $NH_3$ gas to the wafer 200 under the aforementioned condition, at least a portion of the first layer formed over the wafer 200 is nitrided (modified). As the first layer is modified, a second layer containing Si and N, that is, a SiN layer, is formed over the wafer 200. When the second layer is formed, impurities such as Cl contained in the first layer constitute a gaseous substance containing at least Cl in the process of the modifying reaction of the first layer by the $NH_3$ gas, and are discharged from the process chamber 201. As a result, the second layer becomes a layer having fewer impurities such as Cl and the like than the first layer.

After the second layer is formed, the valve 243b is closed to stop the supply of the $NH_3$ gas into the process chamber 201. Then, a gas and the like remaining in the process chamber 201 are excluded from the inside of the process chamber 201 according to the same processing procedure as the purge step in Step 1 (purge step).

As the reactant, in addition to the $NH_3$ gas, it may be possible to use, e.g., hydrogen nitride-based gases such as a diazene ($N_2H_2$) gas, a hydrazine ($N_2H_4$) gas, a $N_3H_8$ gas, and the like.

(Performing Predetermined Number of Times)

A cycle that non-simultaneously (i.e., asynchronously) performs the above-described steps 1 and 2 is performed a predetermined number of times (m times, m being an integer of one or larger) to thereby form a SiN film having a predetermined composition and a predetermined film thickness over the wafer 200. This cycle may be repeated a plurality of times. That is to say, a thickness of the second layer formed per one cycle may be set to be smaller than a desired film thickness. Thus, the above cycle may be repeated a plurality of times until a film thickness of the SiN film formed by laminating the second layers becomes equal to the desired film thickness.

(After-Purging and Returning to Atmospheric Pressure)

After the film forming step is ended, a $N_2$ gas as a purge gas is supplied into the process chamber 201 from each of the nozzles 249a and 249b and is exhausted through the exhaust port 231a. Thus, the inside of the process chamber 201 is purged, and the residual gas and the reaction byproducts remaining in the process chamber 201 are removed from the inside of the process chamber 201 (after-purging). The internal atmosphere of the process chamber 201 is then substituted with an inert gas (inert gas substitution) and the internal pressure of the process chamber 201 is returned to the atmospheric pressure (returning to atmospheric pressure).

(Boat Unloading and Wafer Discharging)

The seal cap 219 is then moved down by the boat elevator 115 to open the lower end of the manifold 209. In addition, the processed wafers 200 supported by the boat 217 are unloaded from the lower end of the manifold 209 to the outside of the reaction tube 203 (boat unloading). After the boat unloading, the shutter 219s is moved, and the lower end opening of the manifold 209 is sealed by the shutter 219s via the O-ring 220c (shutter closing). After being unloaded from the reaction tube 203, the processed wafers 200 are discharged from the boat 217 (wafer discharging).

(3) Cleaning-Processing Process

When the above-described substrate processing is performed, deposits including a thin film such as a SiN film accumulate in the inside of the process container, for example, on the inner wall of the reaction tube 203, the surfaces of the nozzles 249a and 249b, the surface of the boat 217, and so on. That is, the deposits including the thin film adhere to and accumulate on the surfaces of the members in the process chamber 201 heated to a film-forming temperature. Therefore, in the present embodiments, when the amount of deposit accumulated in the process container, that is, the accumulated film thickness, reaches a predetermined amount (thickness) before the deposits peel off or drop, the inside of the process container is cleaned.

The cleaning process of these embodiments includes:

Step A of removing substances adhered in a process container set at a first temperature after processing a wafer 200 as a substrate, that is, the above-mentioned deposits, by supplying a first gas including a fluorine-based gas at a first flow rate into the process container to exhaust the inside of the process container;

Step B of physically desorbing and removing residual fluorine in the process container set at a second temperature higher than the first temperature after performing Step A by supplying a second gas, which does not react chemically with fluorine under the second temperature, at a second flow rate higher than the first flow rate and a third flow rate (which will be described below) into the process container to exhaust the inside of the process chamber; and Step C of chemically desorbing and removing residual fluorine in the process container set at a third temperature higher than the first temperature after performing Step A by supplying a third gas, which reacts chemically with fluorine under the third temperature, at the third flow rate into the process chamber to exhaust the inside of the process chamber.

Figure 4:
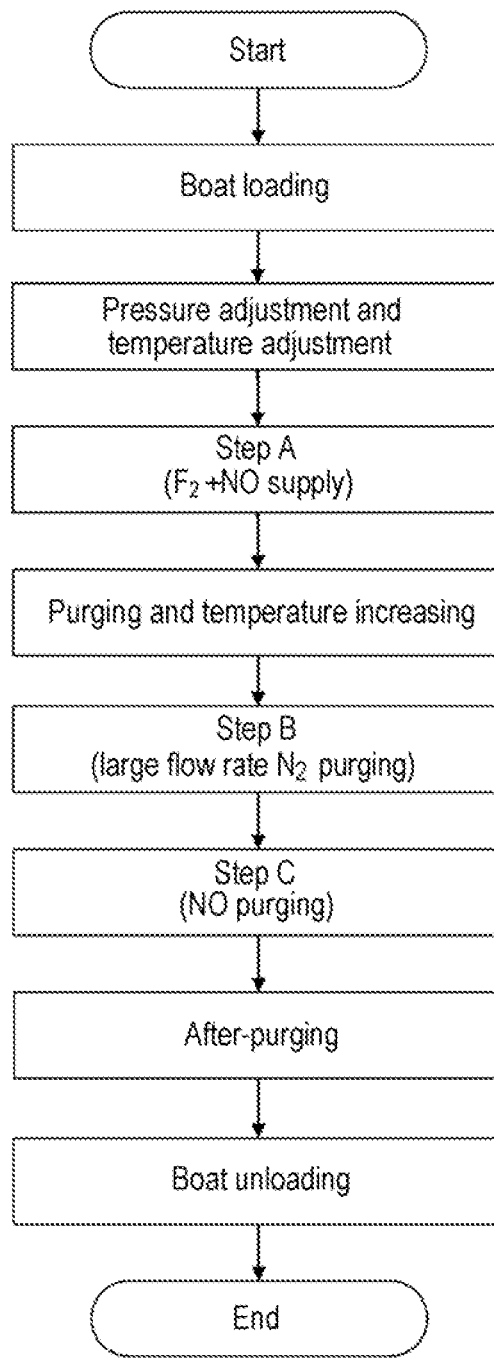
FIG. 4 is a diagram showing a sequence of cleaning processing according to one or more embodiments of the present disclosure.

Hereinafter, an example of the cleaning process using a $F_2$ gas and a NO gas ($F_2$ gas+NO gas) as the first gas, a $N_2$ gas as the second gas, and a NO gas as the third gas will be described with reference to FIG. 4. In the following description, the operations of various parts constituting the substrate processing apparatus are controlled by the controller 121.

(Boat Loading)

The shutter 219s is moved by the shutter-opening/closing mechanism 115s and the lower end opening of the manifold 209 is opened (shutter open). Then, an empty boat 217, that is, a boat 217 not loaded with a wafer 200, is lifted up by the boat elevator 115 to be loaded into the process chamber 201. In this state, the seal cap 219 seals the lower end of the manifold 209 via the O-ring 220b.

(Pressure Adjustment and Temperature Adjustment)

The inside of the process chamber 201 is vacuum-exhausted by the vacuum pump 246 to reach a desired pressure (degree of vacuum). In addition, the inside of the process chamber 201 is heated by the heater 207 to a desired first temperature. At this time, members in the process chamber 201, that is, the inner wall of the reaction tube 203, the surfaces of the nozzles 249a and 249b, the surface of the boat 217, and so on, are also heated to the first temperature. Further, the rotation of the boat 217 by the rotation mechanism 267 is started. The operation of the vacuum pump 246, the heating of the inside of the process chamber 201, and the rotation of the boat 217 are continuously performed until steps A to C to be described below are completed. The boat 217 may not be rotated.

(Step A: $F_2$ Gas+NO Gas Supplying)

After the internal pressure and temperature of the process chamber 201 are stabilized, Step A is started. In this step, a $F_2$ gas and a NO gas are supplied at a first flow rate into the process container set to the first temperature to exhaust the inside of the process chamber. Specifically, the valves 243c and 243d are opened to allow the $F_2$ gas to flow into the gas supply pipe 232c and the NO gas to flow into the gas supply pipe 232d. The flow rates of the $F_2$ gas and the NO gas are adjusted by the MFCs 241c and 241d, respectively, and the $F_2$ gas and the NO gas are supplied into the process chamber 201 via the gas supply pipes 232a and 232b and the nozzles 249a and 249b, respectively. At the same time, the valves 243e and 243f may be opened to supply a $N_2$ gas into the process chamber 201 via the nozzles 249a and 249b.

The example of the process condition in Step A is described as follows.

Supply flow rate of $F_2$ gas (first flow rate): 0.5 to 10 slm
Supply flow rate of NO gas (first flow rate): 0.5 to 10 slm
Supply flow rate of $N_2$ gas: 0.01 to 20 slm
Gas supply time of each gas: 1 to 60 minutes, specifically 10 to 20 minutes
Processing temperature (first temperature): 100 to 500 degrees C., specifically 250 to 350 degrees C.
Processing pressure (first pressure): 1,333 to 40,000 Pa, specifically 1,333 to 16,665 Pa.

By supplying the $F_2$ gas and the NO gas into the process chamber 201 under the aforementioned processing condition, the NO gas can be added to the $F_2$ gas, and these gases can be mixed and reacted in the process chamber 201. This reaction makes it possible to generate, for example, active species such as fluorine radicals (F*) and nitrosyl fluoride (FNO) (hereinafter collectively referred to as FNO or the like) in the process chamber 201. As a result, a mixed gas obtained by adding FNO or the like to the $F_2$ gas is present in the process chamber 201. The mixed gas obtained by adding FNO or the like to the $F_2$ gas contacts the members in the process chamber 201, for example, the inner wall of the reaction tube 203, the surfaces of the nozzles 249a and 249b, the surface of the boat 217, and the like. At this time, the deposits adhered to the members in the process chamber 201 can be removed by the thermochemical reaction (etching reaction). FNO or the like acts to promote the etching reaction by the $F_2$ gas to increase the etching rate of the deposits, that is, to assist the etching.

As the fluorine-based gas, in addition to the $F_2$ gas, it may be possible to use, e.g., a hydrogen fluoride (HF) gas, a nitrogen fluoride ($NF_3$) gas, a chlorine fluoride ($ClF_3$), or a mixed gas thereof. As the gas to be added to the fluorine-based gas, in addition to the NO gas, it may be possible to use, e.g., a hydrogen ($H_2$) gas, an oxygen ($O_2$) gas, a nitrous oxide ($N_2O$) gas, an isopropyl alcohol (($CH_3)_2CHOH$, abbreviation: IPA) gas, a methanol ($CH_3OH$) gas or water vapor ($H_2O$ gas).

(Purge and Temperature Increasing Step)

After a predetermined time has elapsed and the removal of the deposits from the process container is completed, the valves 243c and 243d are closed to stop the supply of the $F_2$ gas and the NO gas into the process chamber 201. Then, the gas and the like remaining in the process chamber 201 are excluded from the inside of the process chamber 201 according to the same processing procedure as the purge step in Step 1 (purge step).

However, even when this purge step is performed for a long time, it is difficult to completely remove fluorine from the inside of the process container. This is because, at the end of Step A, fluorine is physically adsorbed or chemically adsorbed on the surfaces of the members in the process container. The residual fluorine adsorbed on the surfaces of the members in the process container tends to remain in the process container without being desorbed from the surfaces of the members even when the same step as the above-described purging step of Step 1 and after-purging is performed for a long time (for example, 5 to 10 hours) under the first temperature. The fluorine remaining in the process container is one factor that reduces the productivity of the next substrate processing (batch processing) to be performed after the cleaning process. Specifically, when the above-described substrate processing is repeatedly performed after the cleaning process, the deposition rate of a SiN film formed over the wafer 200 may drop significantly due to the influence of residual fluorine in the process container in at least the first several substrate processings.

In order to solve this problem, in the present embodiments, after Step A is performed, Steps B and C to be described below are performed. By performing Step B, the residual fluorine in the process container, which was difficult to remove even when the above-described purge step is performed for a long time, can be physically desorbed from the surfaces of the members in the process container and removed from the inside of the process container. Further, by performing Step C, the residual fluorine in the process container, which was difficult to remove even when the above-described purge step is performed for a long time, can be chemically desorbed from the surfaces of the members in the process container and removed from the inside of the process container. As will be described below, it is preferable to perform Step C after Step B to efficiently remove the residual fluorine in the process container. That is, it is preferable to perform Step B after Step A and to perform Step C after Step B. That is, it is preferable to perform Step A, Step B, and Step C continuously in this order.

In order to exert the above-described operation in Step B, it is necessary to set the internal temperature of the process container to a second temperature higher than the aforementioned first temperature. Further, in order to exert the above-described operation in Step C, it is necessary to set the internal temperature of the process container to a third temperature higher than the aforementioned first temperature. As described above, in the present embodiments, since Steps A, B, and C are performed in this order, here, the output of the heater 207 is adjusted, and the internal temperature of the process chamber 201 is first increased to a temperature required to properly advance Step B, that is, the second temperature higher than the first temperature (temperature increasing step). In addition, it is preferable to start Step B to be described below after the internal temperature of the process chamber 201 reaches the second temperature and is stabilized. By waiting for the internal temperature of the process chamber 201 to be stabilized at the second temperature, since the entire region in the process container can be uniformly heated to the second temperature and Step B to be described below can be performed in that state, it is possible to uniformly obtain the operation of the below-described Step B of physically desorbing and removing the residual fluorine in the process container throughout the entire region in the process container.

(Step B: Large Flow Rate $N_2$ Purging)

In this step, a $N_2$ gas, which does not react chemically with fluorine under the second temperature, is supplied at a second flow rate higher than the aforementioned first flow rate and a third flow rate to be described below into the process container at the second temperature higher than the first temperature set to exhaust the inside of the process container. Specifically, the valves 243e and 243f are opened to allow the $N_2$ gas to flow into the gas supply pipes 232e and 232f, respectively. The flow rate of the $N_2$ gas is adjusted by the MFCs 241e and 241f, and the $N_2$ gas is supplied into the process chamber 201 via the gas supply pipes 232a and 232b and the nozzles 249a and 249b (large flow rate $N_2$ purge). The second flow rate used herein refers to the total flow rate of $N_2$ gas supplied into the process container, that is, the sum of flow rates of $N_2$ gases supplied via the nozzles 249a and 249b.

The example of the process condition in Step B is described as follows.

Supply flow rate of $N_2$ gas (second flow rate): 5 to 50 slm

Supply time of $N_2$ gas: 1 to 300 minutes, specifically 30 to 120 minutes

Processing temperature (second temperature): 500 to 800 degrees C.

Processing pressure (second pressure): 13 to 1,333 Pa.

By supplying the $N_2$ gas into the process container under the second temperature higher than the first temperature and at the second flow rate higher than the first flow rate and the third flow rate, in a state where high thermal energy is given to the residual fluorine in the process container, it is possible to collide the $N_2$ gas supplied at a large flow rate with the residual fluorine. That is, it is possible to collide molecules of the $N_2$ gas with the residual fluorine whose adsorption power is reduced by giving high thermal energy, at a high flow velocity and with high probability. As a result, it is possible to physically desorb and remove the residual fluorine from the inside of the process container efficiently and effectively. The desorbed residual fluorine is discharged through the exhaust port 231a.

By performing this step, most or all of the residual fluorine physically adsorbed on the surfaces of the members in the process container can be physically desorbed and removed from the inside of the process container. Further, in this step, it is also possible to physically desorb and remove not only the residual fluorine physically adsorbed on the surfaces of the members in the process container but also some of the residual fluorine chemically adsorbed on the surfaces of the members. However, even when this step is performed for a long time, it is difficult to completely desorb all the residual fluorine chemically adsorbed on the surfaces of the members in the process container. Therefore, after performing this step for a predetermined time, Step C to be described below is performed.

As the second gas, in addition to the $N_2$ gas, it may be possible to use, e.g., rare gases such as a He gas, an Ar gas, a Ne gas, a Xe gas, and the like.

(Step C: NO Purge)

In this step, a NO gas that reacts chemically with fluorine under a third temperature is supplied at a third flow rate into the process container set to the third temperature higher than the first temperature to exhaust the inside of the process container. Specifically, the valve 243d is opened to allow the NO gas to flow into the gas supply pipe 232d. The flow rate of the NO gas is adjusted by the MFC 241d, and the NO gas is supplied into the process chamber 201 via the gas supply pipe 232b and the nozzle 249b (NO purge).

The example of the process condition in Step C is described as follows.

Supply flow rate of NO gas (third flow rate): 0.01 to 10 slm

Supply time of NO gas: 1 to 120 minutes, specifically 30 to 60 minutes

Processing temperature (third temperature): 500 to 750 degrees C.

Processing pressure (third pressure): 13 to 2,000 Pa.

By supplying the NO gas under the third temperature higher than the first temperature, it is possible to supply the NO gas with the residual fluorine chemically adsorbed in the process container and cause them to react chemically. As a result, it is possible to promote the chemical desorption of the residual fluorine in the process container. The desorbed residual fluorine is discharged through the exhaust port 231a.

By performing this step, it is possible to remove most or all of the residual fluorine chemically adsorbed on the surfaces of the members in the process container from the inside of the process container. Thus, in Step C, the residual fluorine that could not be all removed in Step B can be chemically desorbed and removed. In this step, it is also possible to not only desorb the residual fluorine chemically adsorbed on the surfaces of the members in the process container but also chemically desorb and remove some of the residual fluorine physically adsorbed on the surfaces of the members. However, in order to remove the residual fluorine physically adsorbed on the surfaces of the members in the process container, Step B is more advantageous than Step C in view of the removal efficiency and the gas cost. Therefore, as the present embodiments, it is preferable to perform Step B prior to Step C and remove the residual fluorine, which could not be all removed in Step B, in Step C.

As described above, by sequentially performing Step B of physically desorbing and removing the residual fluorine and Step C of chemically desorbing and removing the residual fluorine, it is possible to discharge the residual fluorine in the process container from the inside of the process container with high efficiency and at low costs.

The processing pressure (third pressure) in this step is preferably set to a pressure larger than the aforementioned second pressure (third pressure>second pressure). By setting the processing pressure in this step in this manner, it is possible to enhance the reactivity between the residual fluorine and the NO gas in the process container and to promote the reaction between them. As a result, chemical desorption of the residual fluorine from the inside of the process container is further promoted, which makes it possible to remove the residual fluorine in the process container from the inside of the process container efficiently and effectively. Further, by setting the processing pressure (third pressure) in this step to a large pressure as described above, the residence time of the NO gas in the process container can be extended, and the NO gas can be spread to every corner in the process container. This makes it possible to uniformly remove the residual fluorine from the entire region in the process container. That is, the operation of Step C of chemically desorbing and removing the residual fluorine in the process container can be uniformly obtained in the entire region in the process container.

The processing temperature (third temperature) in this step is preferably equal to the processing temperature (second temperature) in Step B (third temperature=second temperature). The third temperature may be set to be equal to a film-forming temperature (a processing temperature when processing the wafer 200) (third temperature=second temperature=film-forming temperature). By setting the processing temperature in this step in this manner, it is not necessary to provide a step of changing the internal temperature of the process container, and it is possible to save the time required for increasing/decreasing the internal temperature of the process container, thereby shortening the processing time so much. This makes it possible to reduce the downtime of the substrate processing apparatus. The third temperature may be set to be higher than the second temperature (third temperature>second temperature), in which case, in Step C, the reaction between the residual fluorine and the NO gas in the process container can be further promoted, which makes it possible to further enhance the operation of chemically desorbing and removing the residual fluorine. Further, the second temperature may be set to be higher than the third temperature (second temperature>third temperature), in which case, in Step B, the residual fluorine in the process container may be more easily desorbed, which makes it possible to further enhance the operation of physically removing and removing the residual fluorine.

As the third gas, in addition to the NO gas, it may be possible to use, e.g., nitrogen oxide gases such as a $N_2O$ gas, a nitrogen dioxide ($NO_2$) gas, and the like. Even when a $H_2$ gas or an $NH_3$ gas is used as the third gas, it is possible to react the residual fluorine with the third gas to remove the residual gas from the inside of the process container. However, when these gases are used as the third gas, HF or the like is generated by the reaction between the residual fluorine and the third gas in the process container, and may cause etching damage to the members (particularly quartz members) in the process container. As the present embodiments, using the nitrogen oxide-based gas not containing hydrogen as the third gas makes it possible to solve the above-mentioned problems.

(After-Purging and Returning to Atmospheric Pressure)

After Steps A to C are ended, the inside of the process chamber 201 is purged (after-purging) according to the same processing procedure as the above-described after-purging in the substrate-processing process. The internal atmosphere of the process chamber 201 is then substituted with an inert gas (inert gas substitution) and the internal pressure of the process chamber 201 is returned to the atmospheric pressure (returning to atmospheric pressure).

(Boat Unloading)

The seal cap 219 is moved down by the boat elevator 115 to open the lower end of the manifold 209. Then, an empty boat 217 is unloaded from the lower end of the manifold 209 to the outside of the reaction tube 203 (boat unloading). When these series of processes are ended, the above-described substrate-processing process is resumed.

(Pre-Coating)

In addition, prior to resuming the above-described substrate-processing process, it is preferable to form a pre-coating layer (SiN layer) containing Si and N over the surfaces of the members in the process container (pre-coating) by performing a process on the wafer 200 in the process container set at a fourth temperature after Step C, that is, the same process as the film forming step of the above-described substrate-processing process. This process is preferably performed in a state where the empty boat 217 after the cleaning process is accommodated in the process container.

The fourth temperature may be set to be equal to the second temperature or the third temperature. For example, the fourth temperature may be set to be equal to the second temperature and the third temperature (fourth temperature=third temperature=second temperature). Further, the fourth temperature may also be set to be equal to the film-forming temperature (the processing temperature when processing the wafer 200) (fourth temperature=third temperature=second temperature=film-forming temperature). By setting the fourth temperature to such a temperature, it is not necessary to provide a step of changing the internal temperature of the process container, and it is possible to save the time required for increasing/decreasing the internal temperature of the process container, thereby shortening the processing time so much. This makes it possible to shorten the downtime of the substrate processing apparatus. In addition, it is preferable to perform the pre-coating in a period before performing the above-mentioned boat unloading after performing Step C.

(4) Effects of the Present Embodiments

According to the present embodiments, one or more effects set forth below may be achieved.

(a) By performing Step A and then performing Step B of supplying the $N_2$ gas at the second flow rate higher than each of the first flow rate and the third flow rate into the process container set at the second temperature higher than the first temperature to exhaust the inside of the process container, it is possible to physically desorb and remove the residual fluorine in the process container.

Further, by performing Step A and then performing Step C of supplying the NO gas at the third flow rate into the process container set at the third temperature higher than the first temperature to exhaust the inside of the process container, it is possible to chemically desorb and remove the residual fluorine in the process container.

By the operations of these Steps B and C, it is possible to remove the residual fluorine, which has been difficult to remove from the inside of the process container even when the same step as the above-described purging step of Step 1 and after-purging is performed for a long time, from the inside of the process container. By removing the residual fluorine from the process container, it is possible to resume the substrate processing without deteriorating the productivity of the substrate processing after performing the cleaning process. This makes it possible to shorten the downtime of the substrate processing apparatus.

(b) By starting Step B after the internal temperature of the process chamber 201 reaches the second temperature and is stabilized, the operation of Step B of physically desorbing and removing the residual fluorine in the process container can be obtained uniformly throughout the entire region in the process container. If Step B is started before the internal temperature of the process chamber 201 reaches the second temperature and is stabilized, the operation of Step B of physically desorbing and removing the residual fluorine in the process container may be performed unevenly depending on a temperature difference in the process container.

(c) By setting the internal pressure (third pressure) of the process container in Step C to be higher than the internal pressure (second pressure) of the process container in Step B (third pressure>second pressure), it is possible to promote chemical desorption of the residual fluorine in the process container in Step C more than that in a case of third pressure≤second pressure. As a result, it is possible to further shorten the above-mentioned downtime.

(d) By performing Step C after performing Step B, it is possible to efficiently remove the residual fluorine from the inside of the process container. This makes it possible to further shorten the above-mentioned downtime. In addition, it is possible to suppress an increase in gas cost when removing the residual fluorine from the inside of the process container.

(e) By setting the processing temperature (third temperature) in Step C to be equal to the processing temperature (second temperature) in Step B (third temperature=second temperature), it is not necessary to provide a step of changing the internal temperature of the process container, and it is possible to save the time required for increasing/decreasing the internal temperature of the process container, thereby shortening the processing time so much. This makes it possible to further shorten the above-mentioned downtime.

(f) By setting the processing temperature (third temperature) in Step C to a temperature higher than the processing temperature (second temperature) in Step B (third temperature>second temperature), it is possible to promote chemical desorption of the residual fluorine in the process container in Step C more than that in a case of third pressure≤ second pressure. In addition, by setting the processing temperature (second temperature) in Step B to a temperature higher than the processing temperature (third temperature) in Step C (second temperature>third temperature), it is possible to promote physical desorption of the residual fluorine in the process container in Step B more than that in a case of second pressure≤ third pressure.

(g) By performing the pre-coating before performing the substrate-processing process after performing Step C, it is possible to stabilize the film-forming rate and the quality of substrate processing when the next film-forming process is performed.

(h) By performing Steps A, B, and C under a non-plasma atmosphere, that is, by performing these steps by adding thermal energy to the internal atmosphere of the process container without adding plasma energy, it is possible to prevent the members in the process container from being damaged by plasma.

(i) The above-described effects can be obtained in the same manner when the above-mentioned first gas other than $F_2$ gas+NO gas is used in Step A, the above-mentioned second gas other than the $N_2$ gas is used in Step B, or the above-mentioned third gas other than the NO gas is used in Step C.

(5) Modification Examples

The cleaning process is not limited to the above-described aspect, but may be changed as in the following modification examples which may be used in proper combination. Unless otherwise stated, the processing procedure and processing condition in each step of each modification example may be the same as the processing procedure and processing condition in each step shown in the above-described aspect.

First Modification Example

In Step B, a step of supplying a $N_2$ gas into the process container and a step of exhausting (vacuum-exhausting, or evacuating) the inside of the process container in a state where the supply of the $N_2$ gas into the process container is stopped may be alternately repeated plural times. That is, in Step B, a large flow rate of $N_2$ gas may be intermittently supplied into the process container to cycle-purge the inside of the process container.

The example of the process condition in Step B at this time is described as follows.

$N_2$ gas supply time: 10 to 300 seconds/cycle, specifically 60 to 120 seconds/cycle Vacuum-exhaust time: 10 to 300 seconds/cycle, specifically 60 to 120 seconds/cycle Number of cycles: 1 to 300, specifically 30 to 120

Minimum pressure: 13 to 30 Pa

Maximum pressure: 30 to 1,333 Pa.

The other process condition may be the same as the process condition in Step B of the above-described aspect.

This modification example can obtain the same effects as the cleaning process described with reference to FIG. 4. In addition, according to this modification example, it is possible to further promote physical desorption of the residual fluorine in the process container to remove the residual fluorine from the inside of the process container more effectively in Step B. As a result, it is possible to further shorten the above-mentioned downtime.

Second Modification Example

Steps B and C may be alternately repeated plural times. This modification example also can obtain the same effects as the cleaning process described with reference to FIG. 4. In addition, according to this modification example, it is possible to remove the residual fluorine from the inside of the process container more effectively. As a result, it is possible to further shorten the above-mentioned downtime.

Third Modification Example

When Steps B and C are alternately repeated plural times, the ratio of execution time of Step C to execution time of Step B may be changed. For example, when Steps B and C are alternately repeated plural times, the ratio (TC/TB) of execution time TC of Step C to execution time TB of Step B may be gradually increased. That is, when Steps B and C are alternately repeated plural times, the rate of chemically desorbing and removing the residual fluorine may be gradually increased.

This modification example also can obtain the same effects as the cleaning process described with reference to FIG. 4. In addition, according to this modification example, it is possible to more efficiently and effectively remove the residual fluorine which could not be all removed in Step B. As a result, it is possible to further shorten the above-mentioned downtime. Further, it is possible to appropriately decrease the amount of $N_2$ gas exhausted from the exhaust pipe 231 without contributing to desorption of the residual fluorine in the process container, which can result in reduction in gas cost.

Fourth Modification Example

Step B may be performed after Step C. That is, Steps A, C, and B may be performed continuously in this order. This modification example also can obtain substantially the same effects as the cleaning process described with reference to FIG. 4. However, as described above, performing Steps A, B, and C in this order is advantageous in that the removal efficiency of the residual fluorine from the inside of the process container is high and it is possible to suppress an increase in gas cost.

OTHER EMBODIMENTS

While some embodiments of the present disclosure have been described in detail above, the present disclosure is not limited to the aforementioned embodiments but may be differently modified without departing from the subject matter of the present disclosure.

The example in which the inside of the process container is cleaned after the SiN film is formed over the wafer in the process container has been described in the above embodiments. However, the present disclosure is not limited to such an aspect. For example, the above-described cleaning process can be suitably applied to a case where the inside of the process container is cleaned after forming a silicon film (Si film), a silicon oxide film (SiO film), a silicon oxycarbonitride film (SiOCN film), a silicon oxycarbide film (SiOC film), a silicon oxynitride film (SiON film), a silicon carbonitride film (SiCN film), a silicon borocarbonitride film (SiBCN film), a silicon boronitride film (SiBN film), or the like over the wafer in the process container. Further, the film-forming method is not limited to the method of alternately supplying a precursor and a reactant to the wafer 200, but may be a method of simultaneously and continuously supplying the precursor and the reactant to the wafer 200 or a method of simultaneously and intermittently supplying the precursor and the reactant. Alternatively, it may be possible to use a method of continuously supplying one of the precursor and the reactant while intermittently supplying the other. These cases can obtain the same effects as the above embodiments.

Recipes used in the substrate processing and the cleaning process may be prepared individually according to the processing contents and may be stored in the memory device 121c via a telecommunication line or the external memory device 123. Moreover, at the beginning of the substrate processing and the cleaning process, the CPU 121a may properly select an appropriate recipe from the recipes stored in the memory device 121c according to the contents of the substrate processing and the cleaning process. Thus, it is possible for a single substrate processing apparatus to form films of various kinds, composition ratios, qualities, and thicknesses with enhanced reproducibility. In addition, it is possible to perform an appropriate cleaning process in accordance with deposits including various films adhered in the process container (process chamber 201). Further, it is possible to reduce an operator's burden and to quickly start the substrate processing while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

The example in which films are formed and the inside of the process container is cleaned using a batch-type substrate processing apparatus capable of processing a plurality of substrates at a time has been described in the above embodiments. The present disclosure is not limited to the above embodiments but may be suitably applied, for example, to a case where films are formed and the inside of the process container is cleaned using a single-wafer-type substrate processing apparatus capable of processing a single substrate or several substrates at a time. In addition, the example in which films are formed and the inside of the process container is cleaned using a substrate processing apparatus provided with a hot-wall-type process furnace has been described in the above embodiments. The present disclosure is not limited to the above embodiments but may be suitably applied to a case where films are formed and the inside of the process container is cleaned using a substrate processing apparatus provided with a cold-wall-type process furnace.

In the case of using these substrate processing apparatuses, the substrate processing and the cleaning process may be performed according to the same sequence and process condition as those in the above embodiments and modification examples, and the same effects as those of the above embodiments and modification examples can be achieved.

The above embodiments, modification examples, and so on may be used in proper combination. The processing procedures and process condition used in this case may be the same as those of the above embodiments.

Embodiment Examples

Embodiment Examples and Comparative Examples will be described below with reference to FIGS. 5 and 6.

After performing substrate processing for forming SiN films over wafers using the substrate processing apparatus shown in FIG. 1, that is, batch processing (BAT) for simultaneously forming SiN films over a plurality of wafers, a predetermined number of times, as a Comparative Example, a step ($F_2$+NO_CLN) of removing deposits in the process container using $F_2$ gas+NO gas and a step (After_PRG) of after-purging the inside of the process container were performed in this order (cleaning X). After that, after pre-coating (Pre_CT) the inside of the process container, the BAT was repeatedly performed. The execution times of After_PRG, Pre_CT, and BAT were 2 hours, 2 hours, and 4 hours, respectively. Other process condition was the same as the process condition in each step of an Embodiment Example to be described below.

After performing the above-mentioned BAT repeatedly after the cleaning X, as an Embodiment Example, a step ($F_2$+NO_CLN) of removing deposits in the process container using $F_2$ gas+NO gas, a temperature increasing step (Ramp_Up), a step ($N_2$_cycle_PRG) of physically desorbing residual fluorine by cycle-purging the inside of the process container using a large flow rate of $N_2$ gas, a step (NO_PRG) of chemically desorbing the residual fluorine by purging the inside of the process container using a NO gas, and a step (After_PRG) of after-purging the inside of the process container were performed in this order (cleaning Y). After that, after pre-coating (Pre_CT) the inside of the process container, the BAT was repeatedly performed. The execution times of Ramp_Up, $N_2$_cycle_PRG, and NO_PRG were 0.5 hour, 1 hour, and 0.5 hour, respectively. The execution times of After_PRG, Pre_CT, and BAT were 2 hours, 2 hours, and 4 hours, respectively, similar to the Comparative Example. Other process condition was set as predetermined condition within the process condition range described in the above embodiments.

After performing the cleanings X and Y, each time the above-mentioned BAT was performed, the wafer in-plane average film thickness (hereinafter, in-plane average film thickness) of SiN films formed over wafers was measured. FIG. 5 shows the measurement results of the in-plane average film thickness of the SiN films. In FIG. 5, the horizontal axis represents the number of times of substrate processing after the cleanings X and Y, that is, the number of times of batch processing (BAT number), and the vertical axis represents the in-plane average film thickness (Å) of the SiN films formed over the wafers. In the figure, white bars indicate the in-plane average film thickness of SiN films formed over wafers disposed at the top (Top) of a wafer arrangement region, and shaded bars indicate the in-plane average film thickness of SiN films formed over wafers disposed at the bottom (Btm) of the wafer arrangement region.

Figure 5:
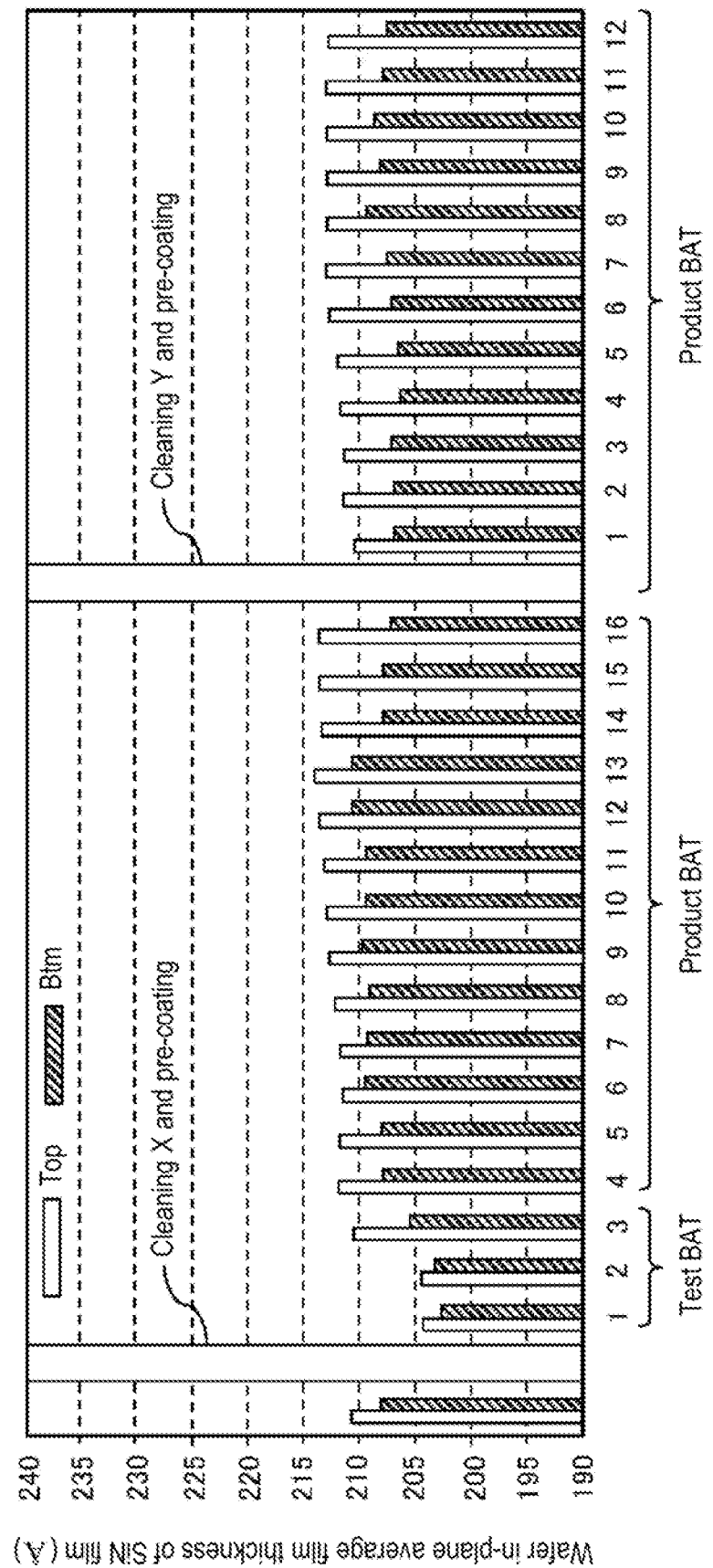
FIG. 5 is a view showing the film thickness of a film formed over a substrate every batch processing (BAT) when repeatedly performing substrate processing, that is, the BAT for simultaneously processing a plurality of substrates (wafers), after cleaning the inside of a process container in an Embodiment Example and a Comparative Example.

As illustrated in FIG. 5, in BAT (first to third) after the cleaning X, the in-plane average film thickness of the SiN films formed over the wafers was smaller than that of BAT (fourth or later) after that. In addition, the deposition rate was temporarily reduced in BAT after the cleaning process. On the other hand, in BAT after the cleaning Y, there was no difference in the in-plane average film thickness of the SiN films formed over the wafers between BAT (first time) immediately after the cleaning Y and BAT (second time or later) after that. In addition, the temporal reduction in the deposition rate did not occur in BAT after the cleaning process.

Figure 6:
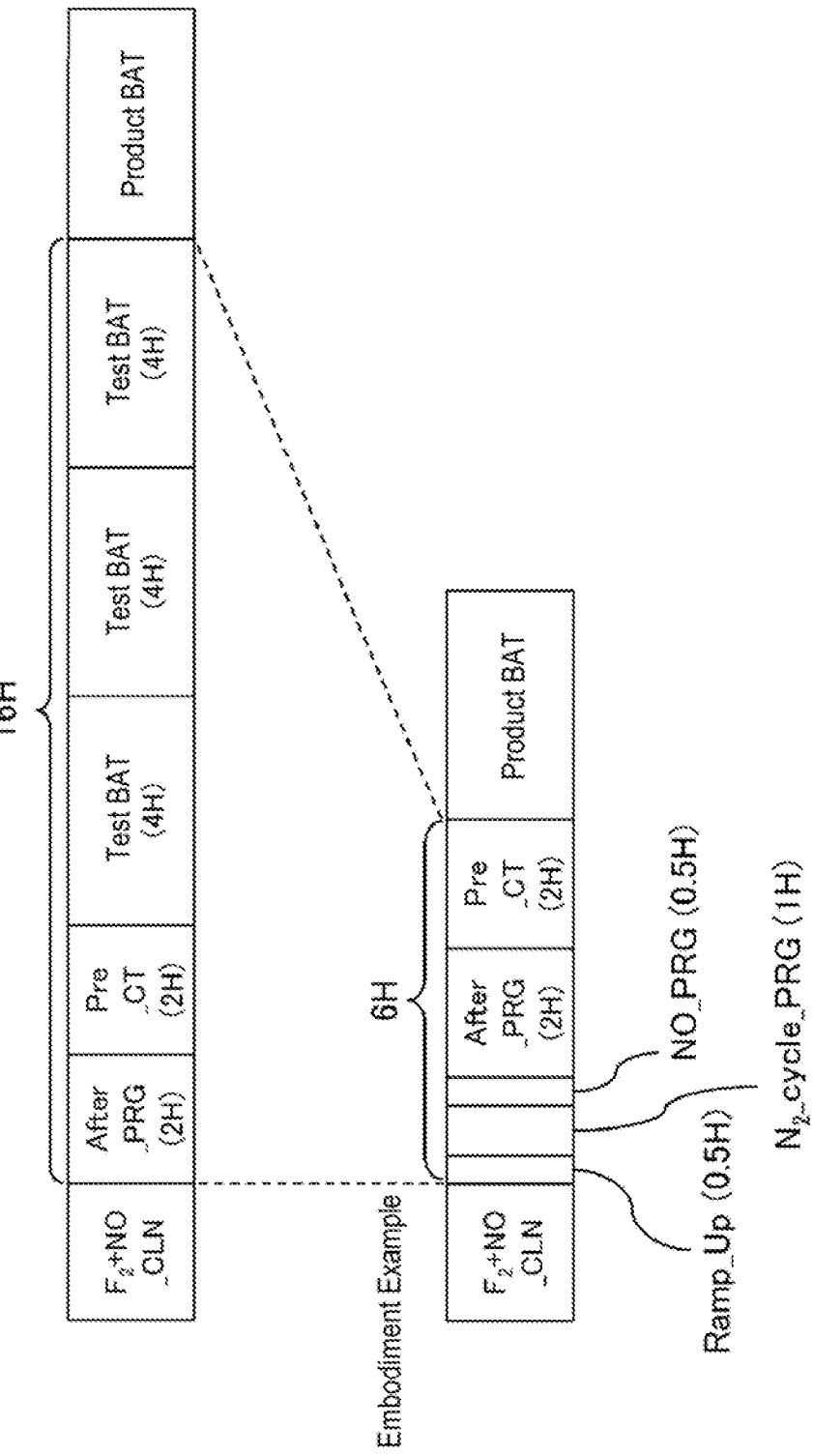
FIG. 6 is a view illustrating a period until substrate processing for a product substrate, that is, batch processing (product BAT) for simultaneously processing a plurality of product substrates (product wafers) is started after cleaning the inside of a process container in the Embodiment Example and the Comparative Example.

As illustrated in FIG. 6, in the Comparative Example, after $F_2$+NO_CLN, until substrate processing on product wafers, that is, batch processing (product BAT) for simultaneously forming SiN films over a plurality of product wafers, can be started, an unstable test BAT with a small deposition rate had to be performed three times, which requires the downtime of about 16 hours. On the other hand, in the Embodiment Example, after $F_2$+NO_CLN, BAT performed at the first time could be a stable product BAT with a large deposition rate (since a test BAT becomes unnecessary). As a result, the downtime could be suppressed to about 6 hours. In this manner, in the Embodiment Example, it was possible to perform the next substrate processing after cleaning the inside of the process container without deteriorating the productivity and hence to significantly shorten the downtime of the substrate processing apparatus.

According to the present disclosure in some embodiments, it is possible to perform the next substrate processing without deteriorating the productivity after cleaning the inside of a process container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of cleaning, comprising:
   (a) removing substances in a process container at a first temperature by supplying a first gas including a fluorine-based gas at a first flow rate into the process container and exhausting an inside of the process container;
   (b) removing fluorine in the process container at a second temperature after performing (a) by supplying a second gas, without supplying the fluorine-based gas, at a second flow rate higher than the first flow rate into the process container and exhausting the inside of the process container; and
   (c) removing fluorine in the process container at a third temperature after performing (a) by supplying a third gas, without supplying the fluorine-based gas, at a third flow rate into the process container and exhausting the inside of the process container, the third gas reacting chemically with fluorine under the third temperature,
   wherein an internal pressure of the process container in (c) is set to be higher than an internal pressure of the process container in (b), and
   wherein (c) is performed after performing (b).

2. The method according to claim 1, wherein (c) is performed after an internal temperature of the process container is stabilized to the third temperature.

3. The method according to claim 1, wherein in (c), fluorine which has not been removed in (b) is removed.

4. The method according to claim 1, wherein the second temperature is higher than the first temperature.

5. The method according to claim 1, wherein the third temperature is higher than the first temperature.

6. The method according to claim 1, wherein the second temperature and the third temperature are set to be substantially equal to each other.

7. The method according to claim 1, further comprising:
(d) performing a process on a substrate in the process container at a fourth temperature after performing (c),
wherein the second temperature, the third temperature, and the fourth temperature are set to be substantially equal to one another.

8. The method according to claim 1, wherein the second flow rate is higher than the third flow rate.

9. The method according to claim 1, wherein in (b), the act of supplying the second gas into the process container and the act of exhausting the inside of the process container are alternately repeated a plurality of times.

10. The method according to claim 1, wherein the second gas includes an inert gas, and the third gas includes a nitrogen oxide-based gas.

11. The method according to claim 10, wherein the first gas further includes a nitrogen oxide-based gas.

12. The method according to claim 10, wherein the nitrogen oxide-based gas includes a nitrogen monoxide gas.

13. The method according to claim 11, wherein the nitrogen oxide-based gas includes a nitrogen monoxide gas.

14. The method according to claim 1, wherein (b) and (c) are alternately repeated a plurality of times.

15. The method according to claim 14, wherein a ratio of an execution time of (c) to an execution time of (b) is changed.

16. The method according to claim 14, wherein a ratio of an execution time of (c) to an execution time of (b) is gradually increased.

17. The method according to claim 1, wherein (a), (b), and (c) are performed under a non-plasma atmosphere.

18. The method according to claim 1, wherein (a), (b), and (c) are performed by applying thermal energy, without applying plasma energy, to an internal atmosphere of the process container.

19. The method according to claim 1, wherein fluorine is physically removed in (b) and fluorine is chemically removed in (c).

20. A method of manufacturing a semiconductor device, comprising:
performing a process on a substrate in a process container; and
cleaning an inside of the process container, the act of cleaning including:
(a) removing substances in the process container at a first temperature by supplying a first gas including a fluorine-based gas at a first flow rate into the process container and exhausting the inside of the process container;
(b) removing fluorine in the process container at a second temperature after performing (a) by supplying a second gas, without supplying the fluorine-based gas, at a second flow rate higher than the first flow rate into the process container and exhausting the inside of the process container; and
(c) removing fluorine in the process container at a third temperature after performing (a) by supplying a third gas, without supplying the fluorine-based gas, at a third flow rate into the process container and exhausting the inside of the process container, the third gas reacting chemically with fluorine under the third temperature,
wherein an internal pressure of the process container in (c) is set to be higher than an internal pressure of the process container in (b), and
wherein (c) is performed after performing (b).

21. A substrate processing apparatus comprising:
a process container in which a substrate is processed;
a heater configured to heat an inside of the process container;
a first gas supply system configured to supply a first gas into the process container;
a second gas supply system configured to supply a second gas into the process container;
a third gas supply system configured to supply a third gas into the process container;
an exhaust system configured to exhaust the inside of the process container; and
a controller configured to be capable of controlling the heater, the first gas supply system, the second gas supply system, the third gas supply system, and the exhaust system to perform a process comprising the method of claim 1.

22. A non-transitory computer-readable recording medium storing a program that causes, by a computer, a substrate processing apparatus to perform a process of cleaning, the process comprising:
(a) removing substances in a process container at a first temperature by supplying a first gas including a fluorine-based gas at a first flow rate into the process container and exhausting an inside of the process container;
(b) removing fluorine in the process container at a second temperature after performing (a) by supplying a second gas, without supplying the fluorine-based gas, at a second flow rate higher than the first flow rate into the process container and exhausting the inside of the process container; and
(c) removing fluorine in the process container at a third temperature after performing (a) by supplying a third gas, without supplying the fluorine-based gas, at a third flow rate into the process container and exhausting the inside of the process container, the third gas reacting chemically with fluorine under the third temperature,
wherein an internal pressure of the process container in (c) is set to be higher than an internal pressure of the process container in (b), and
wherein (c) is performed after performing (b).

* * * * *